United States Patent
Takahashi et al.

(10) Patent No.: US 12,488,992 B2
(45) Date of Patent: Dec. 2, 2025

(54) HIGH ASPECT RATIO DIELECTRIC ETCH WITH CHLORINE

(71) Applicant: Lam Research Corporation, Fremont, CA (US)

(72) Inventors: Rui Takahashi, Fremont, CA (US); Yilun Li, Newark, CA (US); Eric A. Hudson, Berkeley, CA (US); Youn-Jin Oh, Danville, CA (US); Wonjae Lee, Fremont, CA (US); Leonid Belau, Pleasanton, CA (US); Andrew Clark Serino, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 254 days.

(21) Appl. No.: 17/907,401

(22) PCT Filed: Mar. 10, 2021

(86) PCT No.: PCT/US2021/021752
§ 371 (c)(1),
(2) Date: Sep. 26, 2022

(87) PCT Pub. No.: WO2021/202070
PCT Pub. Date: Oct. 7, 2021

(65) Prior Publication Data
US 2023/0127597 A1    Apr. 27, 2023

Related U.S. Application Data

(60) Provisional application No. 63/081,598, filed on Sep. 22, 2020, provisional application No. 63/002,598, filed on Mar. 31, 2020.

(51) Int. Cl.
*H01L 21/311* (2006.01)
*H01J 37/32* (2006.01)
*H01L 21/3213* (2006.01)

(52) U.S. Cl.
CPC .. *H01L 21/31116* (2013.01); *H01J 37/32449* (2013.01); *H01J 37/32724* (2013.01);
(Continued)

(58) Field of Classification Search
None
See application file for complete search history.

(56) References Cited

U.S. PATENT DOCUMENTS 5,180,466 A    1/1993  Shin
5,683,538 A    11/1997 O'Neill et al.
(Continued)

FOREIGN PATENT DOCUMENTS

CN    102741987 A    10/2012
CN    103843117 A    6/2014
(Continued)

OTHER PUBLICATIONS

Chinese First Office Action dated Aug. 22, 2017 issued in Application No. CN 201510543852.X.
(Continued)

*Primary Examiner* — Stephanie P Duclair
(74) *Attorney, Agent, or Firm* — Weaver Austin Villeneuve & Sampson LLP (57) ABSTRACT

Various embodiments herein relate to methods and apparatus for etching recessed features on a semiconductor substrate. The techniques described herein can be used to form high quality recessed features with a substantially vertical profile, low bowing, low twisting, and highly circular features. These high quality results can be achieved with a high degree of selectivity and a relatively high etch rate. In various embodiments, etching involves exposing the substrate to plasma generated from a processing gas that includes a chlorine source, a carbon source, a hydrogen source, and a fluorine source. The chlorine source may have
(Continued)

---

101 — Receive substrate in reaction chamber, the substrate having a patterned mask layer over stack of materials including silicon nitride 103 — Flow process gas into reaction chamber and generate plasma from process gas 105 — Expose substrate to plasma to etch recessed features into stack of materials particular properties. In some cases, particular chlorine sources may be used. Etching typically occurs at low temperatures, for example at about 25 C or lower.

17 Claims, 6 Drawing Sheets

(52) U.S. Cl.
CPC .. *H01L 21/32137* (2013.01); *H01J 37/32091* (2013.01); *H01J 2237/2001* (2013.01); *H01J 2237/334* (2013.01)

(56) References Cited

U.S. PATENT DOCUMENTS

| | | | |
|---|---|---|---|
| 6,071,822 A | 6/2000 | Donohue et al. | |
| 6,313,042 B1 | 11/2001 | Cohen et al. | |
| 6,406,924 B1 | 6/2002 | Grimbergen et al. | |
| 6,638,855 B1 | 10/2003 | Chang et al. | |
| 7,767,024 B2 | 8/2010 | Kao et al. | |
| 8,679,982 B2 | 3/2014 | Wang et al. | |
| 8,679,983 B2 | 3/2014 | Wang et al. | |
| 8,916,477 B2 | 12/2014 | Thedjoisworo et al. | |
| 8,969,212 B2 | 3/2015 | Ren et al. | |
| 9,034,773 B2 | 5/2015 | Thedjoisworo et al. | |
| 9,111,877 B2 | 8/2015 | Chen et al. | |
| 9,202,708 B1 | 12/2015 | Chen et al. | |
| 9,236,266 B2 | 1/2016 | Zhang et al. | |
| 9,330,926 B2 | 5/2016 | Chebi et al. | |
| 9,558,928 B2 | 1/2017 | Thedjoisworo et al. | |
| 9,595,451 B1* | 3/2017 | Zhou | H01L 21/31116 |
| 9,613,822 B2 | 4/2017 | Chen et al. | |
| 9,640,409 B1 | 5/2017 | Yang et al. | |
| 9,911,620 B2 | 3/2018 | Zhu et al. | |
| 10,283,615 B2 | 5/2019 | Yang et al. | |
| 10,741,407 B2 | 8/2020 | Dole et al. | |
| 2002/0045355 A1 | 4/2002 | Chong et al. | |
| 2002/0132422 A1 | 9/2002 | Ranade et al. | |
| 2002/0185469 A1 | 12/2002 | Podlesnik et al. | |
| 2003/0045098 A1 | 3/2003 | Verhaverbeke et al. | |
| 2003/0186545 A1 | 10/2003 | Kamp et al. | |
| 2004/0018741 A1 | 1/2004 | Deshmukh et al. | |
| 2005/0142734 A1 | 6/2005 | Shin | |
| 2007/0202700 A1 | 8/2007 | Leucke et al. | |
| 2008/0268645 A1 | 10/2008 | Kao et al. | |
| 2009/0184089 A1 | 7/2009 | Chebi et al. | |
| 2009/0191714 A1 | 7/2009 | Lai et al. | |
| 2009/0246965 A1 | 10/2009 | Mori et al. | |
| 2010/0003827 A1 | 1/2010 | Kessels et al. | |
| 2010/0203739 A1 | 8/2010 | Becker et al. | |
| 2010/0248487 A1 | 9/2010 | Lee et al. | |
| 2011/0143548 A1 | 6/2011 | Cheung et al. | |
| 2011/0294300 A1 | 12/2011 | Zhang et al. | |
| 2013/0012026 A1* | 1/2013 | Fuller | H01L 21/3065 257/E21.252 |
| 2013/0089988 A1 | 4/2013 | Wang et al. | |
| 2013/0298942 A1 | 11/2013 | Ren et al. | |
| 2014/0004707 A1 | 1/2014 | Thedjoisworo et al. | |
| 2014/0004708 A1 | 1/2014 | Thedjoisworo et al. | |
| 2014/0054269 A1 | 2/2014 | Hudson et al. | |
| 2014/0166617 A1 | 6/2014 | Chen et al. | |
| 2015/0064919 A1 | 3/2015 | Kim et al. | |
| 2015/0075715 A1 | 3/2015 | Thedjoisworo et al. | |
| 2015/0079797 A1 | 3/2015 | Chen et al. | |
| 2016/0042968 A1 | 2/2016 | Purayath et al. | |
| 2016/0043099 A1 | 2/2016 | Purayath et al. | |
| 2016/0064212 A1 | 3/2016 | Thedjoisworo et al. | |
| 2016/0064519 A1 | 3/2016 | Yang et al. | |
| 2016/0093505 A1 | 3/2016 | Chen et al. | |
| 2016/0247688 A1 | 8/2016 | Zhu et al. | |
| 2016/0260616 A1 | 9/2016 | Li et al. | |
| 2016/0293440 A1 | 10/2016 | Nagatomo et al. | |
| 2016/0300725 A1 | 10/2016 | Ambati et al. | |
| 2017/0110335 A1 | 4/2017 | Yang et al. | |
| 2017/0207099 A1 | 7/2017 | Ohtake et al. | |
| 2018/0151435 A1 | 5/2018 | Chiang et al. | |
| 2018/0286707 A1* | 10/2018 | Hudson | H01J 37/3244 |
| 2019/0221654 A1 | 7/2019 | Yang et al. | |
| 2019/0393047 A1 | 12/2019 | Dole et al. | |
| 2021/0051792 A1 | 2/2021 | Dokan et al. | |
| 2023/0335378 A1 | 10/2023 | Hudson | |
| 2024/0420963 A1 | 12/2024 | Zhang et al. | |

FOREIGN PATENT DOCUMENTS

| | | | |
|---|---|---|---|
| EP | 0658928 A1 | 6/1995 | |
| JP | H11260913 A | 9/1999 | |
| JP | 2000236021 A | 8/2000 | |
| JP | 2001144028 A | 5/2001 | |
| JP | 2001244214 A | 9/2001 | |
| JP | 2003309083 A | 10/2003 | |
| JP | 2005530345 A | 10/2005 | |
| JP | 2014017406 A | 1/2014 | |
| JP | 2019145780 A | 8/2019 | |
| KR | 20080061930 A | 7/2008 | |
| KR | 20100078965 A | 7/2010 | |
| KR | 20190098922 A | 8/2019 | |
| TW | 483103 B | 4/2002 | |
| TW | 200607017 A | 2/2006 | |
| TW | 200739715 A | 10/2007 | |
| TW | 201207934 A | 2/2012 | |
| TW | 201541553 A | 11/2015 | |
| TW | 201802938 A | 1/2018 | |
| WO | WO-2019138654 A1 | 7/2019 | |
| WO | WO-2019235398 A1 | 12/2019 | |
| WO | WO-2020055837 A1 | 3/2020 | |

OTHER PUBLICATIONS

Chinese First Office Action dated Jul. 17, 2019 issued in Application No. CN 201610996940.X.
Chinese Second Office Action dated Feb. 25, 2020 issued in Application No. CN 201610996940.X.
International Preliminary Report on Patentability dated Oct. 13, 2022, in PCT Application No. PCT/US2021/021752.
International Search Report and Written Opinion dated Jun. 29, 2021, in PCT Application No. PCT/US2021/021752.
Japanese First Office Action dated Jun. 5, 2019 issued in Application No. JP 2015-167336.
Korean First Office Action dated Nov. 27, 2019 issued in Application No. KR 10-2013-0076689.
KR Office Action dated Feb. 28, 2022, in Application No. KR1020150121582 with English translation.
Nishino et al. (1993) "Damage-free selective etching of Si native oxides using NH3/NF3 and SF6/H2O down-flow etching," J. Appl. Phys. 74(2):1345-1348.
Sidhwa, A.J. et al., "Reactive ion etching of crystalline silicon using $NF_3$ diluted with $H_2$", Journal of Vacuum Science & Technology A, 1993, vol. 11, No. 4, pp. 1156-1160.
Taiwan First Office Action dated Dec. 25, 2018 issued in Application No. TW 104128251.
Taiwan Office Action and Search Report dated Nov. 22, 2016 issued in Application No. TW 102123510.
Taiwanese First Office Action dated Jun. 8, 2020 issued in Application No. TW 105136072.
U.S. Final Office Action, dated Nov. 6, 2014, issued in U.S. Appl. No. 13/916,497.
U.S. Notice of Allowance dated Dec. 28, 2018 issued in U.S. Appl. No. 14/938,635.
U.S. Notice of Allowance, dated Feb. 13, 2015, issued in U.S. Appl. No. 13/916,497.
U.S. Notice of Allowance, dated Nov. 16, 2016, issued in U.S. Appl. No. 14/547,974.
U.S. Notice of Allowance, dated Sep. 11, 2014, issued in U.S. Appl. No. 13/916,387.
U.S. Notice of Allowance, dated Sep. 27, 2016, issued in U.S. Appl. No. 14/577,977.

(56) References Cited

OTHER PUBLICATIONS

U.S. Office Action, dated Jun. 1, 2018 issued in U.S. Appl. No. 14/938,635.
U.S. Office Action dated Jun. 27, 2019 issued in U.S. Appl. No. 16/364,797.
U.S. Office Action, dated Mar. 17, 2017, issued in U.S. Appl. No. 14/547,974.
U.S. Office Action, dated May 27, 2016, issued in U.S. Appl. No. 14/577,977.
U.S. Office Action, dated May 30, 2014, issued in U.S. Appl. No. 13/916,497.
U.S. Office Action, dated May 7, 2014, issued in U.S. Appl. No. 13/916,387.
Wolf, Stanley, Ph.D., (2002) "Silicon Processing for the VLSI Era," Lattice Press, Sunset Beach, 4:Chapter 3, p. 75.
International Preliminary Report on Patentability and Written Opinion dated May 16, 2024 in PCT Application No. PCT/US2022/079143.
International Search Report and Written Opinion dated Mar. 10, 2023 from PCT/US2022/079143.
TW Office Action dated Jul. 31, 2024 in TW Application No. 110111113 with English translation.
JP Office Action dated Jan. 7, 2025 in JP Application No. 2022-559559 with English translation.
U.S. Restriction Requirement dated Jan. 16, 2025 in U.S. Appl. No. 18/003,138.
KR Office Action dated Jun. 5, 2025 in KR Application No. 10-2022-7037978, with English Translation.
JP Office Action dated Aug. 5, 2025 in JP Application No. 2022-559559, with English Translation.

* cited by examiner

HIGH ASPECT RATIO DIELECTRIC ETCH WITH CHLORINE

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

BACKGROUND

One process frequently employed during fabrication of semiconductor devices is formation of an etched cylinder or other recessed feature in dielectric material. Often the dielectric material includes alternating/repeating layers into which the recessed feature is formed. One example context where such a process may occur is memory applications such as 3D NAND. As the semiconductor industry advances and device dimensions become smaller, such recessed features become increasingly harder to etch in a uniform manner, especially for high aspect ratio features having narrow widths and/or deep depths.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods and apparatus for etching recessed features on a semiconductor substrate. For example, in one aspect of the disclosed embodiments, a method of etching recessed features on a substrate is provided, the method including: (a) providing the substrate on a substrate support in a reaction chamber, the substrate having a stack thereon, the stack including one or more layers of a first material including a silicon-containing material alternating with one or more layers of a second material, the substrate further including a patterned mask layer positioned over the stack; (b) flowing processing gas into the reaction chamber and generating a plasma from the processing gas, wherein the processing gas includes: (i) a chlorine source meeting at least one of the following conditions: (1) the chorine source includes chlorine gas ($Cl_2$), (2) the chlorine source includes hydrogen chloride (HCl), (3) the chlorine source includes molecules containing only carbon and chlorine, (4) the chlorine source includes molecules containing only carbon, hydrogen, and chlorine, (5) the chlorine source includes molecules containing only carbon, hydrogen, bromine, and chlorine, and/or (6) the chlorine source includes molecules containing only chlorine, carbon, and nitrogen, (ii) a carbon source, (iii) a fluorine source, and (iv) a hydrogen source; and (c) exposing the substrate to the plasma to etch recessed features into the stack on the substrate, the recessed features being etched through one or more of the layers of the first material and through one or more of the layers of the second material, wherein the substrate support is maintained at a cryogenic temperature during etching.

In certain embodiments, the first material includes silicon nitride and the second material includes silicon oxide. In some such embodiments, the stack may further include one or more layers of a third material alternating with the one or more layers of the first material including silicon nitride and the one or more layers of the second material including silicon oxide. The third material may include polysilicon in various embodiments. In some implementations, the first material includes silicon nitride and the second material includes polysilicon.

In various implementations, the chlorine source may include one or more particular reactants. For instance, the chlorine source may include $Cl_2$. In some cases, the chlorine source may include $CCl_4$ and/or $C_2Cl_2$. In some cases, the chlorine source includes $C_xH_yCl_z$, where x>0, y>0, and z>0. For instance, the chlorine source may include $CH_2Cl_2$ and/or $C_2H_2Cl_2$. In some embodiments, the chlorine source includes at least one species selected from the group consisting of $CCl_4$, $CH_2Cl_2$, $C_2H_2Cl_2$, $CHCl_3$, $CH_3Cl$, $C_2H_5Cl$, $C_2H_4Cl_2$, $C_2H_3Cl_3$, $C_2H_3Cl$, $C_2Cl_2$, ClCN, $CH_2BrCl$, $C_2H_2BrCl$, and $C_2H_4BrCl$.

In some implementations, the chlorine source may have particular properties. For instance, the chlorine source may include molecules containing only carbon and chlorine. In some cases the chlorine source may include molecules containing only carbon, hydrogen, and chlorine. In some cases the chlorine source may include molecules containing only carbon, hydrogen, bromine, and chlorine. In some cases the chlorine source may include molecules containing only chlorine, carbon, and nitrogen.

Certain processing conditions may be controlled during etching. In some embodiments, the substrate support is maintained at a cryogenic temperature between about −40° C. and −10° C. during etching. In these or other embodiments, the plasma may be a capacitively coupled plasma generated at an RF power between about 10-100 kW.

The other species present in the processing gas may include particular reactants and/or properties. For instance, in some cases the hydrogen source includes at least one material selected from the group consisting of: $H_2$, $CH_xF_y$ (where 1≤x≤4, and x+y=4), $C_xH_yF_z$ (where z>0), and combinations thereof. In some such embodiments, hydrogen source includes $H_2$. In these or other embodiments, the fluorine source may include at least one material selected from the group consisting of: $NF_3$, $CH_xF_y$ (where 0≤x≤3, and x+y=4), $C_xF_y$ (where y>x), $C_xH_yF_z$ (where z>0), and combinations thereof. In these or other embodiments, the carbon source may include at least one material selected from the group consisting of: $CH_xF_y$ (where 0≤x≤4, and x+y=4), $C_xF_y$ (where y≥x), $C_xH_yF_z$ (where z>0), and combinations thereof. In a particular embodiment, the processing gas includes $Cl_2$, $H_2$, $NF_3$, $CH_2F_2$, $CF_4$, and at least one of HBr and $CF_3I$.

In some cases, the etching may be carried out in a manner that achieves certain results. For example, the recessed features that are formed may have a 3σ twist of about 10 nm or less. In these or other embodiments, the recessed features that are formed may have a depth of at least about 4000 nm. In these or other embodiments, the recessed features that are formed may have an ellipticity of about 1.15 or less. In these or other embodiments, the recessed features that are formed may have a maximum critical dimension of about 115 nm or less, and/or a Max-Bottom CD of about 40 nm or less.

In another aspect of the disclosed embodiments, an apparatus for etching recessed features on a substrate is provided, the apparatus including: (a) a reaction chamber; (b) a substrate support positioned within the reaction chamber; (c) a plasma generator configured to generate a plasma within the reaction chamber; (d) one or more inlets to the reaction chamber; and (e) a controller configured to cause: (i) providing the substrate on the substrate support in the reaction chamber; (ii) flowing processing gas into the reaction chamber and generating the plasma from the processing gas, wherein the processing gas includes (1) a chlorine source meeting at least one of the following conditions: (a) the chorine source includes chlorine gas ($Cl_2$), (b) the chlorine source includes hydrogen chloride (HCl), (c) the chlorine source includes molecules containing only carbon and chlorine, (d) the chlorine source includes molecules containing only carbon, hydrogen, and chlorine, (e) the chlorine source includes molecules containing only carbon, hydrogen, bromine, and chlorine, and/or (f) the chlorine source includes molecules containing only chlorine, carbon, and nitrogen, (2) a carbon source, (3) a fluorine source, and (4) a hydrogen source; and (iii) exposing the substrate to the plasma to etch the recessed features into a stack on the substrate, the stack including one or more layers of a first material including a silicon-containing material alternating with one or more layers of a second material, wherein the recessed features are etched through one or more of the layers of the first material and through one or more of the layers of the second material, and wherein the substrate support is maintained at a cryogenic temperature during etching.

In various embodiments, the apparatus may be configured to cause any of the methods claimed or otherwise described herein.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Fabrication of certain semiconductor devices involves etching features into a stack of materials using plasma-based etch processes. In various embodiments herein, the stack of materials includes alternating/repeating layers of dielectric material. In a number of cases, at least one of the layers in the stack is or includes silicon nitride. In one example, the stack includes alternating layers of silicon oxide and silicon nitride. In another example, the stack includes alternating layers of silicon oxide, silicon nitride, and polysilicon. In another example, the stack includes alternating layers of silicon nitride and polysilicon. Additional layers may be present as desired for a particular application.

The features etched into the dielectric material may be cylinders, trenches, or other recessed features. As the aspect ratio of such features continues to increase, several issues arise including (1) twisting of the features, (2) non-circularity of the features, (3) aspect-ratio dependent etch rate, (4) bowing etch profile, (5) insufficient mask selectivity, and (6) low etch rate. Twisting refers to random deviations between the intended bottom locations of the features and the actual final bottom locations of the features (e.g., with the final location of a feature corresponding to the position of the bottom of the feature after the feature is etched). For instance, in some cases it is intended that cylindrical features are etched in a regular array. When some or all features randomly deviate at the bottom away from this array, they are understood to have twisted.

Non-circularity of the features refers to deviations of the bottom hole shape away from a circular hole shape. This issue is relevant when etching circular features such as cylinders, where it is desired that the bottoms of the recessed features are circular. When the bottom hole shape deviates away from a circular shape, it often forms a shape closer to an ellipse, triangle, or irregular polygon. In many cases these non-circular shapes are not desirable.

Aspect-ratio dependent etch rate refers to an issue where the etch rate slows down as the aspect ratio of the features increases. In other words, as the features are etched further into the dielectric material, the etching process slows down. This issue is problematic because it can lead to low throughput and associated high processing costs.

Bowing etch profile refers to the tendency for the features to etch laterally in the dielectric layer such that the final profile bows outwards excessively somewhere along the depth of the features. In other words, the actual maximum critical dimension of the features exceeds the desired maximum critical dimension of the features, which can compromise the integrity of the structures being formed and/or limit the electrical performance of the final devices.

Insufficient mask selectivity is problematic when the etch process removes an excessive amount of mask, such no mask remains at the end of the process, or such that the amount of mask remaining is insufficient to properly transfer the pattern from the mask to the dielectric film(s). One common result of insufficient mask selectivity is the degradation of the feature profile near the top of the recessed features.

Low etch rate refers to an etch rate that is slower than desired for a particular application. Low etch rate is problematic because it leads to long etch times, reduced throughput, and high processing costs.

Unfortunately, techniques that improve some of these issues often make other issues worse. As such, these issues are balanced against one another when designing an etching operation. For example, conventional commercially practiced dielectric etch processes often result in substantial bowing. Cryogenic temperature etch processes have recently been developed to address the bowing problem associated with the conventional commercially practiced dielectric etch processes. Such cryogenic temperature processes are defined as processes where the substrate support is cooled to a temperature of about 25° C. or less, in some cases about 0° C. or less. Advantageously, the cryogenic temperature processes also result in a relatively high etch rate and relatively low bowing. However, these cryogenic temperature processes substantially exacerbate issues related to twisting and non-circularity of the features. Previously, such tradeoffs have been difficult to avoid.

The techniques described herein may be used to etch recessed features into dielectric material without some or all of the issues identified above. In other words, the disclosed techniques may be used to etch recessed features into dielectric material with little or no twisting, reasonably circular features, an acceptable degree of aspect ratio dependent etch rate, acceptable bowing, sufficient mask selectivity, and sufficient etch rate.

In various embodiments herein, a particular set of reactants is used. The reactants include a chlorine source, a carbon source, a fluorine source, and a hydrogen source. Example chlorine sources include, but are not limited to, $Cl_2$, HCl, $CCl_4$, $C_xH_yCl_z$ (where z>0). Particular examples of $C_xH_yCl_z$ materials include, but are not limited to, chloroform ($CHCl_3$) and methylene chloride ($CH_2Cl_2$). In some embodiments, the chlorine source may be $CH_yCl_z$ or $C_2H_yCl_2$. In various embodiments, the chlorine source does not include fluorine or other non-chlorine halogens.

Example carbon sources include, but are not limited to, $CH_xF_y$ (where 0≤x≤4, and x+y=4), $C_xF_y$ (where y>x), and $C_xH_yF_z$ (where z>0) or combinations thereof. Example fluorine sources include, but are not limited to, $CH_xF_y$ (where 0≤x≤3, and x+y=4), $C_xF_y$ (where y≥x), $C_xH_yF_z$ (where z>0), and $NF_3$. Example hydrogen sources include, but are not limited to, hydrogen ($H_2$), $CH_xF_y$ (where 1≤x≤4, and x+y=4), and $C_xH_yF_z$ (where z>0). In some embodiments, the reactants may further include one or more non-fluorine and non-chlorine halogen source, examples of which include, but are not limited to, HBr, $I_2$, and $CF_3I$. The chlorine source works in combination with reactants that produce abundant H radicals and F radicals, as well as the carbon source, to produce the exceptional etch results described herein.

In some embodiments, the reactants include $Cl_2$, $H_2$, $NF_3$, and $CH_xF_y$ (where 0≤x≤4, and x+y=4). In some embodiments, the reactants include $Cl_2$, $H_2$, $NF_3$, $CH_2F_2$, $CF_4$, and at least one of HBr and $CF_3I$. Various other combinations of reactants are possible and considered to be within the scope of the disclosed embodiments.

The substrate may be maintained at a cryogenic temperature during etching. This temperature control may be accomplished by controlling the temperature of a substrate support on which the substrate is positioned during etching. In certain embodiments, the substrate support is maintained at a cryogenic temperature of about 25° C. or less, or about 15° C. or less, or about 0° C. or less. In some cases, the substrate support may be maintained at a cryogenic temperature as low as about −40° C., or as low as about −70° C., or in some cases even lower. In some embodiments, the substrate support may be maintained at a cryogenic temperature between about −30° C. and −10° C. By operating at relatively low etching temperatures, the benefits associated with low temperature etching can be captured, such as a low degree of bowing, a relatively high etch rate, and a low degree of aspect-ratio dependent etch rate. Advantageously, the inclusion of chlorine gas as a reactant reduces or eliminates the problems associated with low temperature etching such as twisting and non-circularity.

While chlorine gas is commonly used to etch other materials such as polysilicon, aluminum, and other metals and metal-containing compounds, it has not typically been used to etch silicon-containing dielectric materials such as silicon oxide and silicon nitride. Previously, chlorine gas has shown very poor etch results when used to etch these silicon-containing dielectric materials. However, the inventors have found that when chlorine gas is used in combination with certain reactants at certain temperatures, the issues described above related to twisting and non-circularity are substantially reduced. Unexpectedly, these issues are reduced without exacerbating other issues related to aspect-ratio dependent etch rate, bowing, mask selectivity, and etch rate.

Without being bound by theory or mechanism of action, it is believed that the embodiments herein reduce the twisting and non-circularity issues typically associated with low temperature etching by avoiding excessive deposition of plasma species and/or etch byproducts on the sidewalls of the recessed features at high aspect ratios. Because chlorine gas has previously shown poor etching results when used to etch silicon-containing dielectrics, it is believed that the primary function of the chlorine gas may not be to etch the silicon-containing material itself, but rather, to control the degree to which species present in the reaction chamber adhere to the sidewalls of the growing features. Such surface-chemical interactions were not expected.

One application for the disclosed methods is in the context of forming a DRAM device. In this case, the feature may be etched primarily in silicon oxide as well as one, two, or more layers of silicon nitride, for instance. In one example, a substrate includes a silicon oxide layer sandwiched between two silicon nitride layers, with the silicon oxide layer being between about 400-1800 nm thick and one or more of the silicon nitride layers being between about 20-600 nm thick. The etched feature may be a cylinder having a final depth between about 1-3 μm, for example between about 1.5-2 μm. The cylinder may have a width between about 10-50 nm, for example between about 15-30 nm. After the cylinder is etched, a capacitor memory cell can be formed therein.

Another application for the disclosed methods is in the context of forming a vertical NAND (VNAND, also referred to as 3D NAND) device. In this case, the material into which the feature is etched may have a repeating layered structure. For instance, the material may include alternating layers of silicon oxide and silicon nitride. The repeating layered structure comprises pairs or repeating groups of materials. In various cases, the number of pairs or repeating groups may be between about 10-500 (e.g., between about 20-1000 individual layers). Based on current device dimensions, the oxide layers may have a thickness between about 20-50 nm, for example between about 30-40 nm. The nitride or polysilicon layers may have a thickness between about 20-50 nm, for example between about 30-40 nm. The feature etched into the stack of layers may have a depth between about 2-15 μm, for example between about 5-9 μm. The feature may have a width between about 20-450 nm, for example between about 50-100 nm.

The dimensional/parametric details provided herein, such as high aspect ratio, thickness, width, and depth, etc., are for example and illustration only. Based on the disclosure described herein, it should be understood that varying dimensions/parameters may also be applicable or used.

Figure 1:
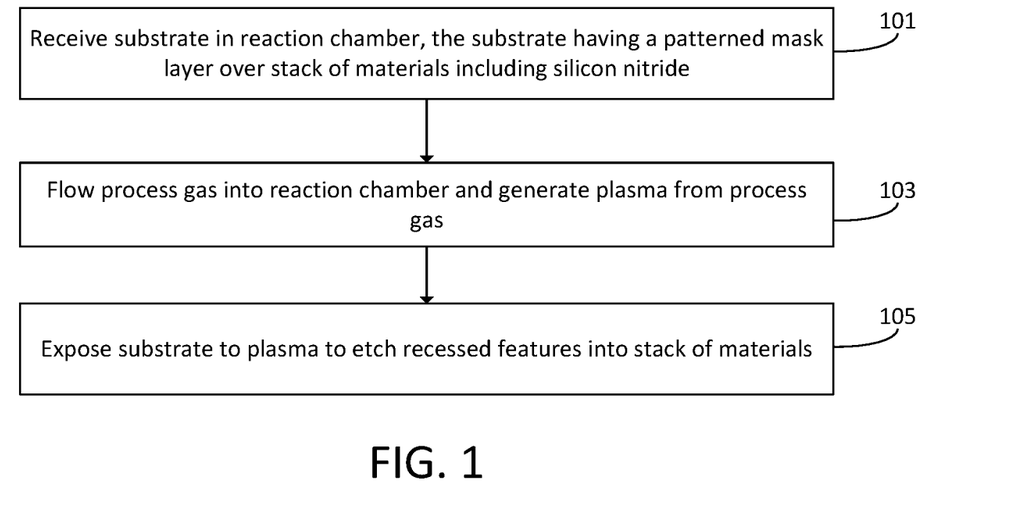
FIG. 1 depicts a flow chart describing a method of etching recessed features into a stack containing dielectric material according to various embodiments.

FIG. 1 is a flowchart describing a method of etching a stack containing dielectric material according to various embodiments herein. The method begins at operation 101, where a substrate is received in a reaction chamber. The reaction chamber is an etching chamber configured to etch a semiconductor substrate. The substrate received in the reaction chamber includes a stack of materials thereon. The stack of materials includes one or more layers of silicon nitride. In addition to the silicon nitride, the stack of materials may include one or more layers of silicon oxide, and/or one or more layers of polysilicon. Particular combinations of stack materials are mentioned above. A patterned mask layer is provided above the stack. The pattern provided in the mask layer defines where the recessed features are to be formed in the stack.

Next, at operation 103, a process gas (which may be a mixture of gases combined before or after delivery to the reaction chamber) is flowed into the reaction chamber and a plasma is generated from the process gas. The process gas includes a chlorine source, a carbon source, a fluorine source, and a hydrogen source, as described further above. The process gas may also include one or more inert gases.

In certain embodiments, particular conditions may be used to generate the plasma. In many cases, the plasma is a capacitively coupled plasma. The plasma may be generated at an RF power between about 5-200 kW, for example between about 10-100 KW, or between about 10-65 kW in some embodiments. In some cases, dual-frequency RF may be used to generate the plasma. Thus, the RF power may be provided at two or more frequency components, for example a first frequency component at about 400 kHz and a second frequency component at about 60 MHz. Different powers may be provided at each frequency component. For instance, the first frequency component (e.g., about 400 kHz) may be provided at a power between about 10-40 kW, for example about 25 kW, and the second frequency component (e.g., about 60 MHz) may be provided at a different power, for example between about 0.5-8 kW, for example about 4 kW. These power levels assume that the RF power is delivered to a single 300 mm wafer. The power levels can be scaled linearly based on substrate area for additional substrates and/or substrates of other sizes (thereby maintaining a uniform power density delivered to the substrate). In other cases, three-frequency RF power may be used to generate the plasma. In some cases, the applied RF power may be pulsed at repetition rates of 1-50,000 Hz. The RF power may be pulsed between two non-zero values (e.g., between higher power and lower power states) or between zero and a non-zero value (e.g., between off and on states). Where the RF power is pulsed between two non-zero values, the powers mentioned above may relate to the higher power state, and the lower power state may correspond to an RF power of about 600 W or lower. The maximum ion energy at the substrate may be relatively high, for example between about 1-10 kV. The maximum ion energy is determined by the applied RF power in combination with the details of RF excitation frequencies, electrode sizes, electrode placement, chamber geometry, and plasma interactions.

The pressure in the reaction chamber may be between about 5-100 mTorr, in some cases between about 15-50 mTorr. As mentioned above, the substrate may be maintained at a cryogenic temperature by maintaining the substrate support at a desired temperature. Example temperatures are discussed above.

In some cases, the process gas (or one or more species therein) may be flowed into the reaction chamber at particular flow rates. For example, in some cases the chlorine gas ($Cl_2$) or other chlorine source may be provided to the reaction chamber at a flow rate between about 10-100 sccm. Where hydrogen gas ($H_2$) is used, it may be provided to the reaction chamber at a flow rate between about 20-500 sccm. Where $NF_3$ is used, it may be provided to the reaction chamber at a flow rate between about 5-100 sccm. A total flow rate of $CH_xF_y$ species may be between about 10-300 sccm. Where $CH_2F_2$ is used, it may be provided to the reaction chamber at a flow rate between about 10-300 sccm. Where $CF_4$ is used, it may be provided to the reaction chamber at a flow rate between about 5-100 sccm. Where HBr is used, it may be provided to the reaction chamber at a flow rate between about 5-100 sccm. Where $CF_3I$ is used, it may be provided to the reaction chamber at a flow rate between about 5-50 sccm.

Returning to FIG. 1, the method continues at operation 105, where the substrate is exposed to the plasma for a sufficient duration to etch the recessed features into the stack of materials. The feature is etched through at least one silicon nitride layer in the stack. In some cases, the substrate may be exposed to the plasma for a duration between about 2000-3000 s. In some cases, the process parameters such as power, pressure, and gas flow are adjusted in a series of recipe steps. The patterned mask layer protects the underlying stack materials at positions where the patterned mask layer is present. This ensures that the recessed features are formed at the openings patterned into the mask layer, where the recessed features are desired.

In another manifestation, another method for etching recessed features on a substrate is provided. In this embodiment, the substrate comprises at least a first silicon containing layer and a patterned mask layer positioned over the stack. A process gas is flowed into the reaction chamber. The process gas comprises a chlorine source selected from molecules containing only carbon and chlorine, or molecules containing only carbon, hydrogen, and chlorine, or molecules containing only carbon, hydrogen, bromine, and chlorine, or molecules containing only chlorine, carbon, and nitrogen. In some embodiments, the chlorine source is at least one chlorine source selected from the group consisting of carbon tetrachloride ($CCl_4$), dichloroacetylene ($C_2Cl_2$), cyanogen chloride (ClCN), bromochloromethane ($CH_2BrCl$), 1-bromo-2-chloroethane ($C_2H_4BrCl$), dichloromethane ($CH_2Cl_2$), 1,1 and trans-1,2- and cis-1,2-isomers of dichloroethene ($C_2H_2Cl_2$), chloroform ($CHCl_3$), chloromethane ($CH_3Cl$), chloroethane ($C_2H_5Cl$), 1,2-dichloroethane or 1,1-dichloroethane ($C_2H_4Cl_2$), 1,1,1 and 1,1,2 isomers of trichloroethane ($C_2H_3Cl_3$), vinyl chloride ($C_2H_3Cl$), bromochloromethane ($CH_2BrCl$), cis- and trans-1-bromo-2-chloroethene ($C_2H_2BrCl$), and 1-bromo-1-chloroethane ($C_2H_4BrCl$). The process gas further comprises a carbon source, a fluorine source, and a hydrogen source. A plasma is generated from the process gas. The substrate is exposed to the plasma to etch the recessed features into the stack on the substrate, the recessed features being etched through at least the first silicon containing layer, wherein the substrate support is maintained at a cryogenic temperature of about 25° C. or lower during etching. In some embodiments, molecules that are the chlorine source are also the carbon source. In other embodiments, molecules that are the carbon source are chlorine-free, and are different from molecules that are the chlorine source. In various embodiments, the chlorine source, carbon source, fluorine source and hydrogen source are all different molecules.

An etch with reduced twisting may be achieved by providing a chlorine-containing source which comprises at least one of (1) molecules containing only carbon and chlorine, or (2) molecules containing only carbon, hydrogen, and chlorine, or (3) molecules containing only carbon, hydrogen, bromine, and chlorine, or (4) molecules containing only chlorine, carbon, and nitrogen. In order to provide a chlorine source with multiple Cl atoms and sufficient vapor pressure to enable simple incorporation into typical gas delivery apparatus, in some embodiments the chlorine source is at least one of $C_2Cl_2$, $CH_2Cl_2$, and trans-1,2-$C_2H_2Cl_2$.

Apparatus

Figure 2A:
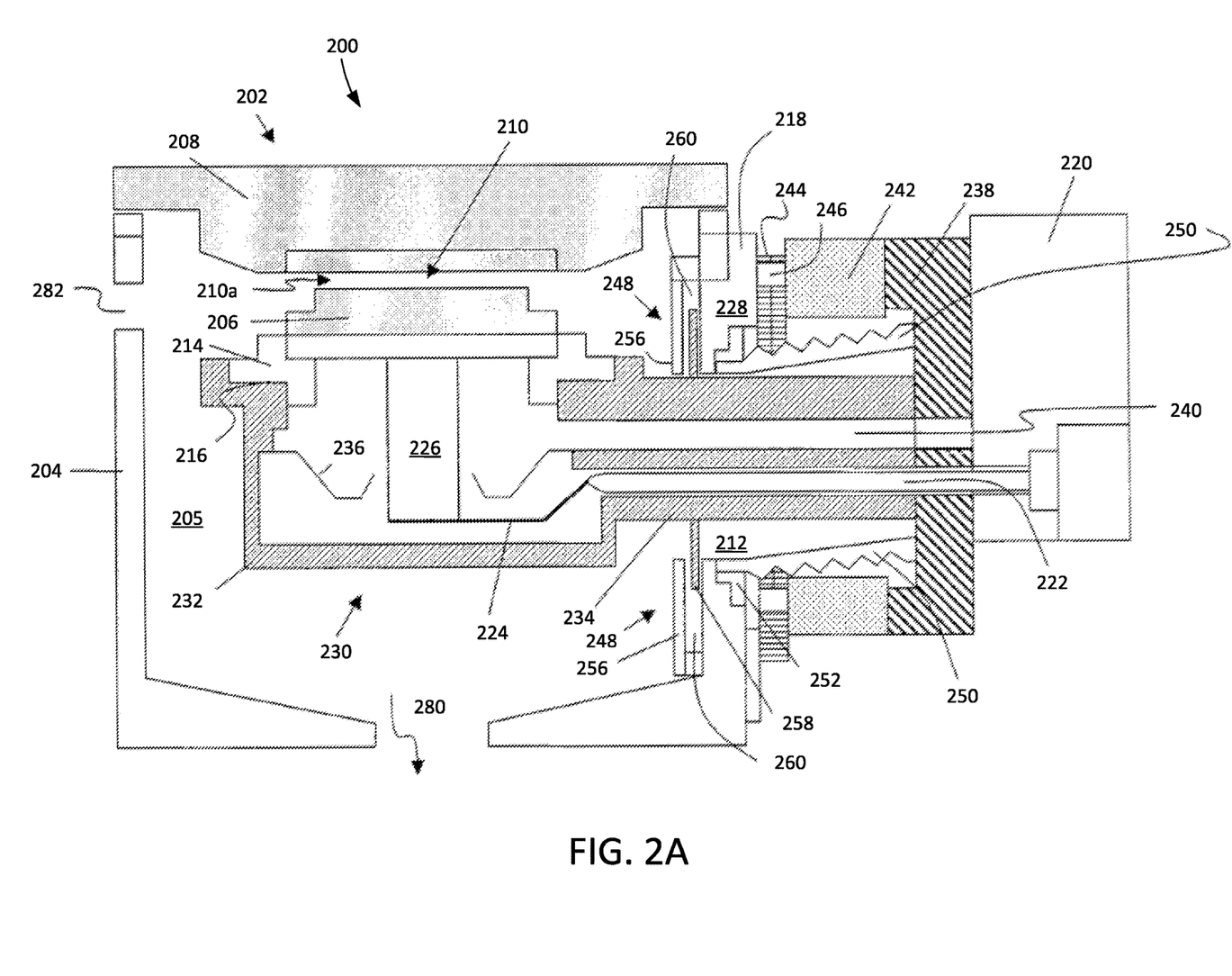
FIGS. 2A-2C illustrate a reaction chamber that may be used to perform the techniques described herein according to certain embodiments.
Figure 2B:
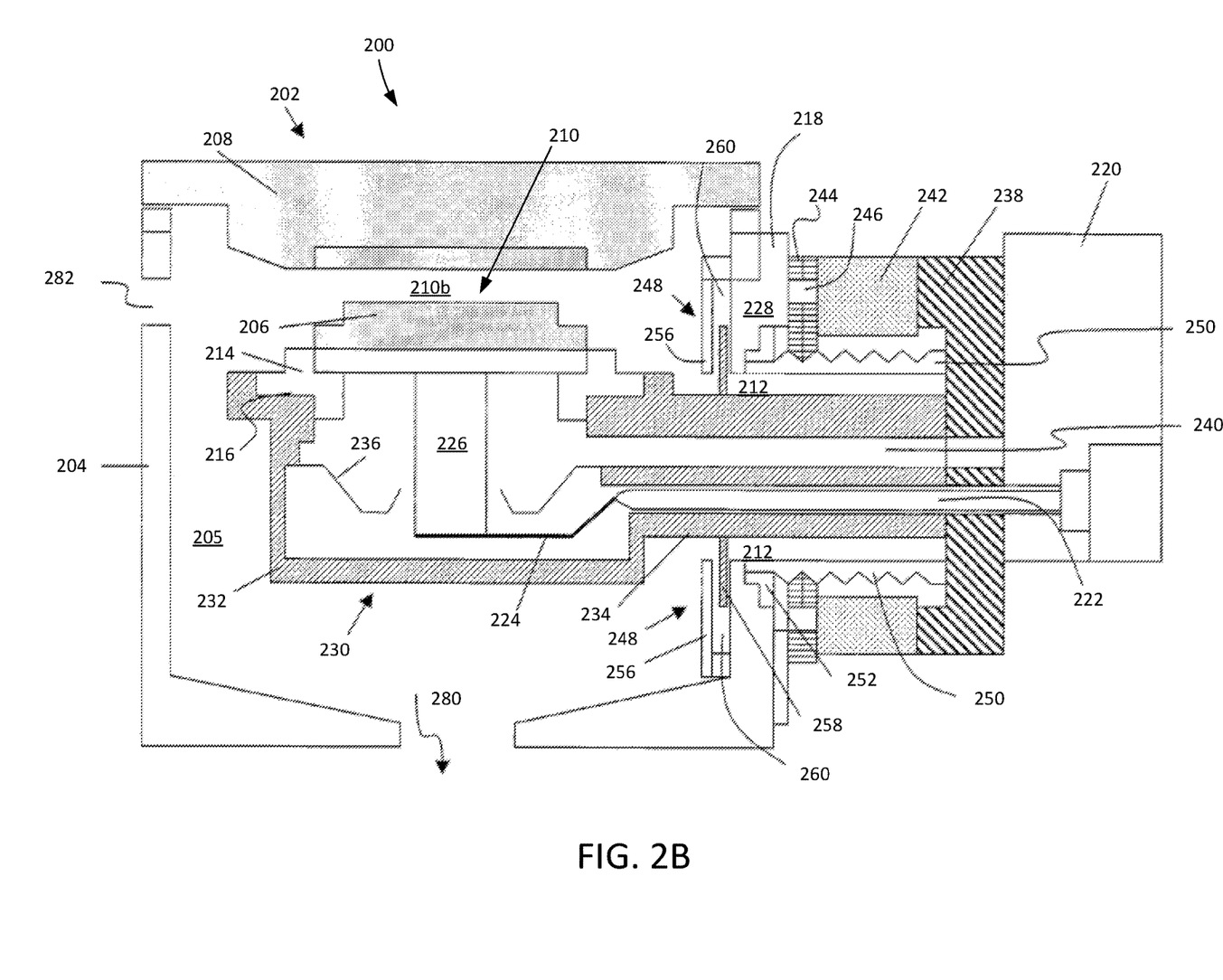
Figure 2C:
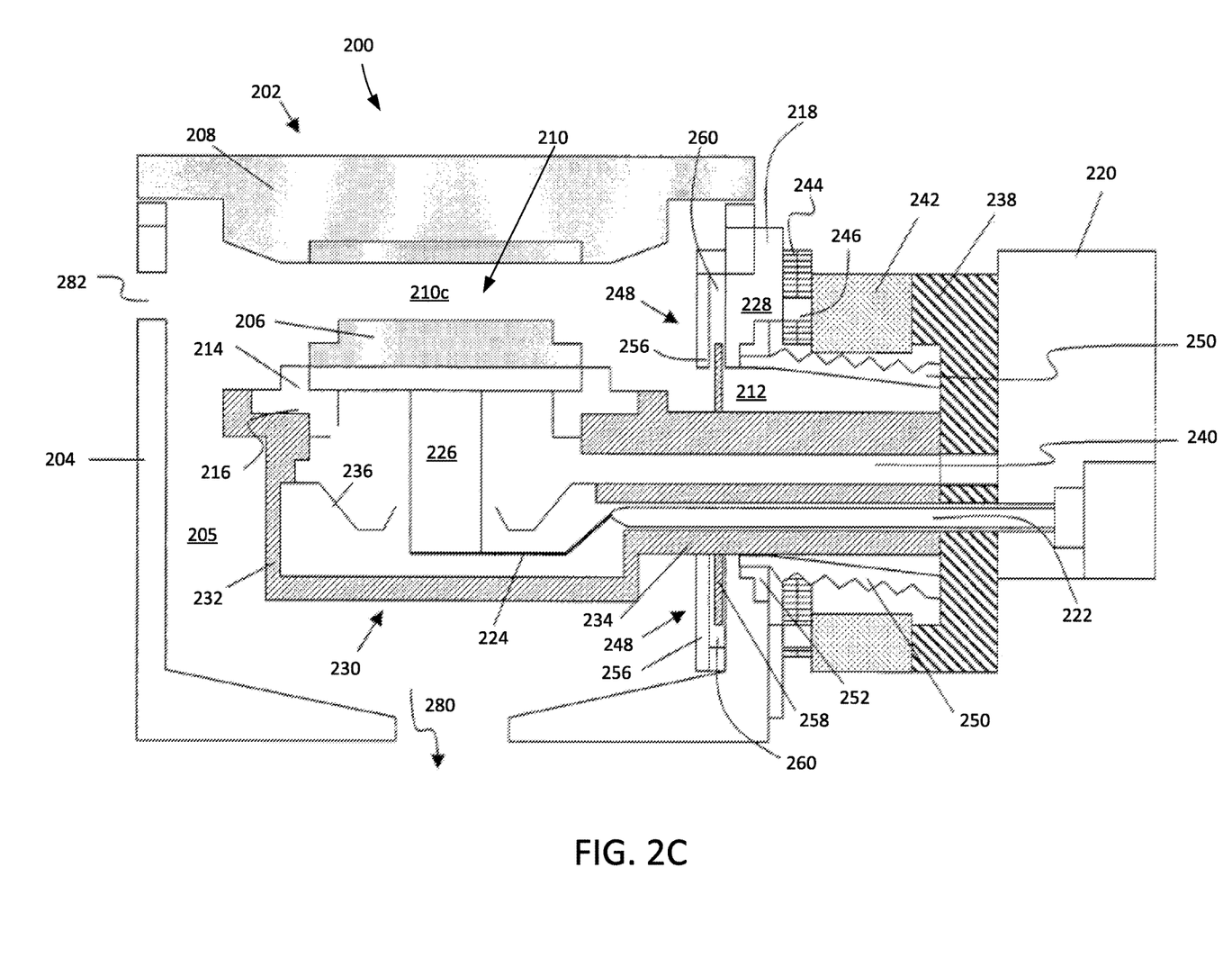

FIGS. 2A-2C illustrate an embodiment of an adjustable gap capacitively coupled confined RF plasma reactor 200 that may be used for performing the etching operations described herein. As depicted, a vacuum chamber 202 includes a chamber housing 204, surrounding an interior space housing a lower electrode 206. In an upper portion of the chamber 202 an upper electrode 208 is vertically spaced apart from the lower electrode 206. The upper electrode 208 may be used as a plasma generator. Planar surfaces of the upper and lower electrodes 208, 206 are substantially parallel and orthogonal to the vertical direction between the electrodes. Preferably the upper and lower electrodes 208, 206 are circular and coaxial with respect to a vertical axis. A lower surface of the upper electrode 208 faces an upper surface of the lower electrode 206. The spaced apart facing electrode surfaces define an adjustable gap 210 therebetween. During operation, the lower electrode 206 is supplied RF power by an RF power supply (match) 220. RF power is supplied to the lower electrode 206 though an RF supply conduit 222, an RF strap 224 and an RF power member 226. A grounding shield 236 may surround the RF power member 226 to provide a more uniform RF field to the lower electrode 206. A wafer is inserted through wafer port 282 that provides an inlet for the wafer. The wafer is supported in the gap 210 on the lower electrode 206 for processing, a process gas (e.g., including chlorine gas or other chlorine source, and the other reactants described herein) is supplied to the gap 210 and excited into plasma state by the RF power. The upper electrode 208 can be powered or grounded.

In the embodiment shown in FIGS. 2A-2C, the lower electrode 206 is supported on a lower electrode support plate 216. An insulator ring 214 interposed between the lower electrode 206 and the lower electrode support plate 216 insulates the lower electrode 206 from the support plate 216.

An RF bias housing 230 supports the lower electrode 206 on an RF bias housing bowl 232. The bowl 232 is connected through an opening in a chamber wall plate 218 to a conduit support plate 238 by an arm 234 of the RF bias housing 230. In a preferred embodiment, the RF bias housing bowl 232 and RF bias housing arm 234 are integrally formed as one component, however, the arm 234 and bowl 232 can also be two separate components bolted or joined together.

The RF bias housing arm 234 includes one or more hollow passages for passing RF power and facilities, such as gas coolant, liquid coolant, RF energy, cables for lift pin control, electrical monitoring and actuating signals from outside the vacuum chamber 202 to inside the vacuum chamber 202 at a space on the backside of the lower electrode 206. The RF supply conduit 222 is insulated from the RF bias housing arm 234, the RF bias housing arm 234 providing a return path for RF power to the RF power supply 220. A facilities conduit 240 provides a passageway for facility components. The gap 210 is preferably surrounded by a confinement ring assembly or shroud (not shown). The interior of the vacuum chamber 202 is maintained at a low pressure by connection to a vacuum pump through vacuum portal 280.

The conduit support plate 238 is attached to an actuation mechanism 242. The actuation mechanism 242, such as a servo mechanical motor, stepper motor or the like is attached to a vertical linear bearing 244, for example, by a screw gear 246 such as a ball screw and motor for rotating the ball screw. During operation to adjust the size of the gap 210, the actuation mechanism 242 travels along the vertical linear bearing 244. FIG. 2A illustrates the arrangement when the actuation mechanism 242 is at a high position on the linear bearing 244 resulting in a small gap 210a. FIG. 2B illustrates the arrangement when the actuation mechanism 242 is at a mid position on the linear bearing 244. As shown, the lower electrode 206, the RF bias housing 230, the conduit support plate 238, the RF power supply 220 have all moved lower with respect to the chamber housing 204 and the upper electrode 208, resulting in a medium size gap 210b.

FIG. 2C illustrates a large gap 210c when the actuation mechanism 242 is at a low position on the linear bearing. Preferably, the upper and lower electrodes 208, 206 remain co-axial during the gap adjustment and the facing surfaces of the upper and lower electrodes across the gap remain parallel.

This embodiment allows the gap 210 between the lower and upper electrodes 206, 208 in the CCP chamber 202 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 206, 208.

FIG. 2A illustrates laterally deflected bellows 250 sealed at a proximate end to the conduit support plate 238 and at a distal end to a stepped flange 228 of chamber wall plate 218. The inner diameter of the stepped flange defines an opening 212 in the chamber wall plate 218 through which the RF bias housing arm 234 passes. The distal end of the bellows 250 is clamped by a clamp ring 252.

The laterally deflected bellows 250 provides a vacuum seal while allowing vertical movement of the RF bias housing 230, conduit support plate 238 and actuation mechanism 242. The RF bias housing 230, conduit support plate 238 and actuation mechanism 242 can be referred to as a cantilever assembly. Preferably, the RF power supply 220 moves with the cantilever assembly and can be attached to the conduit support plate 238. FIG. 2B shows the bellows 250 in a neutral position when the cantilever assembly is at a mid position. FIG. 2C shows the bellows 250 laterally deflected when the cantilever assembly is at a low position.

A labyrinth seal 248 provides a particle barrier between the bellows 250 and the interior of the plasma processing chamber housing 204. A fixed shield 256 is immovably attached to the inside inner wall of the chamber housing 204 at the chamber wall plate 218 so as to provide a labyrinth groove 260 (slot) in which a movable shield plate 258 moves vertically to accommodate vertical movement of the cantilever assembly. The outer portion of the movable shield plate 258 remains in the slot at all vertical positions of the lower electrode 206.

In the embodiment shown, the labyrinth seal 248 includes a fixed shield 256 attached to an inner surface of the chamber wall plate 218 at a periphery of the opening 212 in the chamber wall plate 218 defining a labyrinth groove 260. The movable shield plate 258 is attached and extends radially from the RF bias housing arm 234 where the arm 234 passes through the opening 212 in the chamber wall plate 218. The movable shield plate 258 extends into the labyrinth groove 260 while spaced apart from the fixed shield 256 by a first gap and spaced apart from the interior surface of the chamber wall plate 218 by a second gap allowing the cantilevered assembly to move vertically. The labyrinth seal 248 blocks migration of particles spalled from the bellows 250 from entering the vacuum chamber interior 205 and blocks radicals from process gas plasma from migrating to the bellows 250 where the radicals can form deposits which are subsequently spalled.

FIG. 2A shows the movable shield plate 258 at a higher position in the labyrinth groove 260 above the RF bias housing arm 234 when the cantilevered assembly is in a high position (small gap 210a). FIG. 2C shows the movable shield plate 258 at a lower position in the labyrinth groove 260 above the RF bias housing arm 234 when the cantilevered assembly is in a low position (large gap 210c). FIG. 2B shows the movable shield plate 258 in a neutral or mid position within the labyrinth groove 260 when the cantilevered assembly is in a mid position (medium gap 210b). While the labyrinth seal 248 is shown as symmetrical about the RF bias housing arm 234, in other embodiments the labyrinth seal 248 may be asymmetrical about the RF bias housing arm 234.

Figure 3:
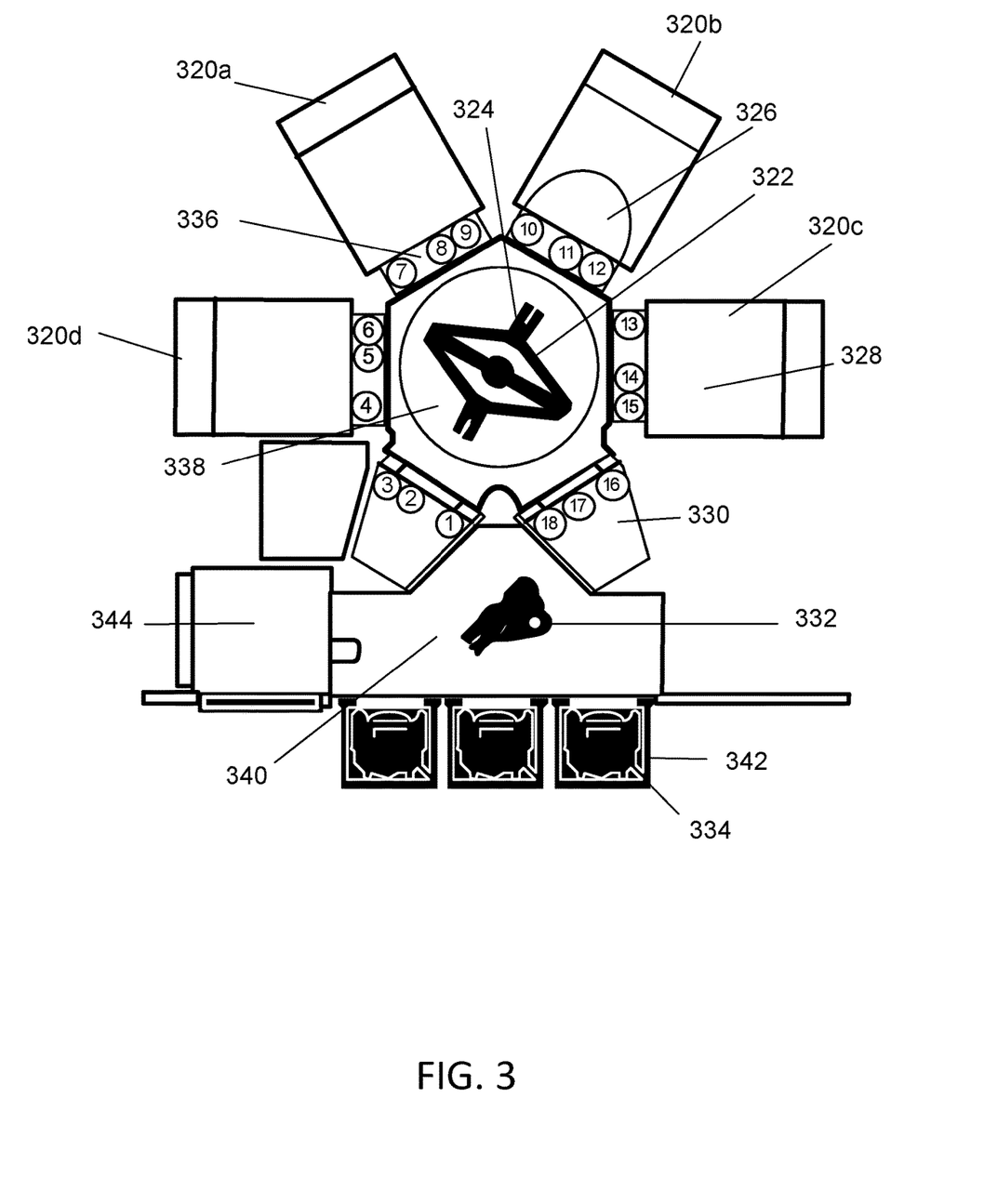
FIG. 3 shows a semiconductor process cluster architecture that may be used to perform the techniques described herein according to certain embodiments.

FIG. 3 depicts a semiconductor process cluster architecture with various modules that interface with a vacuum transfer module 338 (VTM). The arrangement of transfer modules to "transfer" substrates among multiple storage facilities and processing modules may be referred to as a "cluster tool architecture" system. Airlock 330, also known as a loadlock or transfer module, is shown in VTM 338 with four processing modules 320a-320d, which may be individually optimized to perform various fabrication processes. By way of example, processing modules 320a-320d may be implemented to perform substrate etching, deposition, ion implantation, substrate cleaning, sputtering, and/or other semiconductor processes as well as laser metrology and other defect detection and defect identification methods. One or more of the processing modules (any of 320a-320d) may be implemented as disclosed herein, i.e., for etching recessed features into substrates. Airlock 330 and process modules 320a-320d may be referred to as "stations." Each station has a facet 336 that interfaces the station to VTM 338. Inside the facets, sensors 1-18 are used to detect the passing of substrate 326 when moved between respective stations.

Robot 322 transfers substrates between stations. In one implementation, the robot may have one arm, and in another implementation, the robot may have two arms, where each arm has an end effector 324 to pick substrates for transport. Front-end robot 332, in atmospheric transfer module (ATM) 340, may be used to transfer substrates from cassette or Front Opening Unified Pod (FOUP) 334 in Load Port Module (LPM) 342 to airlock 330. Module center 328 inside process modules 320a-320d may be one location for placing the substrate. Aligner 344 in ATM 340 may be used to align substrates.

In an exemplary processing method, a substrate is placed in one of the FOUPs 334 in the LPM 342. Front-end robot 332 transfers the substrate from the FOUP 334 to the aligner 344, which allows the substrate 326 to be properly centered before it is etched, or deposited upon, or otherwise processed. After being aligned, the substrate is moved by the front-end robot 332 into an airlock 330. Because airlock modules have the ability to match the environment between an ATM and a VTM, the substrate is able to move between the two pressure environments without being damaged. From the airlock module 330, the substrate is moved by robot 322 through VTM 338 and into one of the process modules 320a-320d, for example process module 320a. In order to achieve this substrate movement, the robot 322 uses end effectors 324 on each of its arms. In process module 320a, the substrate undergoes etching as described. Next, the robot 322 moves the substrate out of processing module 320a to its next desired position.

It should be noted that the computer controlling the substrate movement can be local to the cluster architecture, or can be located external to the cluster architecture in the manufacturing floor, or in a remote location and connected to the cluster architecture via a network.

In some implementations, a controller is part of an apparatus or system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The above detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

Unless otherwise defined for a particular parameter, the terms "about" and "approximately" as used herein are intended to mean±10% with respect to a relevant value.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed. Certain references have been incorporated by reference herein. It is understood that any disclaimers or disavowals made in such references do not necessarily apply to the embodiments described herein. Similarly, any features described as necessary in such references may be omitted in the embodiments herein. The subject matter of the present disclosure includes all novel and nonobvious combinations and subcombinations of the various processes, systems and configurations, and other features, functions, acts, and/or properties disclosed herein, as well as any and all equivalents thereof.

Experimental

Experimental results have proven that the disclosed methods may be used to etch a dielectric-containing stack of materials on a substrate with improved results compared to previous etching methods. In particular, the disclosed methods may be used to achieve the benefits associated with low temperature etching (e.g., little or no bowing, low degree of aspect-ratio dependent etch rate, and high etch rate) without the problems typically associated with low temperature etching (e.g., twisting and non-circularity of the resulting features). These results were achieved in the context of a successful 3D NAND application (e.g., a 3D NAND application within acceptable specifications/tolerances, discussed further below). These results represent a substantial improvement over both conventional commercially practiced etching methods and newer cryogenic temperature etching methods.

Table 1 below shows experimental results related to three different etch processes. Processes A and B were cryogenic temperature etch processes that did not use chlorine gas or other chlorine source, while process C was a cryogenic temperature etch process that did use chlorine gas according to an embodiment herein.

TABLE 1

|  | Process A | Process B | Process C |
|---|---|---|---|
| Etch depth (nm) | 3880 | 3956 | 3958 |
| Etch rate (nm/min) | 302 | 360 | 231 |
| CD at bottom of feature (nm) | 51 | 37 | 40 |
| Maximum CD (nm) | 87 | 94 | 89 |
| Max-Bottom CD (nm) | 36 | 57 | 49 |

TABLE 1-continued

|  | Process A | Process B | Process C |
|---|---|---|---|
| Selectivity | 4.2 | 3.2 | 3.4 |
| 3σ Twist (nm) | 16 | 16 | 5 |
| Ellipticity (major/minor) | 1.05 | 1.14 | 1.04 |

As used herein, CD refers to the critical dimension (e.g., width in a direction parallel to the surface of the substrate) of a feature at a particular location within the feature. The "Max–Bottom CD" refers to the difference between the maximum critical dimension of a feature and the critical dimension at the bottom of the feature. Selectivity refers to a ratio between the etch rate of the material targeted for removal and the etch rate of the mask material. For example, if the target material etches at a rate of 200 nm/min and the mask etches at a rate of 50 nm/min, the selectivity is calculated as 200/50, which may be reported as 4:1 or more simply 4. The twist refers to the degree to which the features deviate away from the desired array pattern. The twist reported herein is the "3σ twist" (e.g., three sigma twist), which is calculated as the standard deviation of hole-to-hole distance at the bottom of the features, multiplied by three. Because twist is not a desirable feature, it is preferable for the 3σ twist to be as low as possible. Ellipticity describes to the degree to which the bottoms of cylindrical features deviate from a perfect circle towards an elliptical shape, and is calculated as the ratio of major axis length to minor axis length for an ellipse fitted to the bottom hole shape. Features that are perfect circles have an ellipticity of 1.0. Because circular features are often desired (e.g., when etching cylinders), it is preferable for the ellipticity to be close to 1.0.

The results in Table 1 show that the disclosed techniques can be used to substantially improve issues related to twist and non-circularity of the etched features. The inclusion of chlorine gas at low etch temperatures achieves the benefits of the low temperature etch regime, without the twist and non-circularity problems typically observed with such low temperature etching. These results indicate a substantial improvement over previously obtainable results.

In certain embodiments herein, the features that are formed may conform to certain standards which define a successful process for 3DNAND applications. For instance, the features may have a 3σ twist of about 20 nm or less, or about 15 nm or less, or about 10 nm or less, or about 8 nm or less. This low degree of twist may be accomplished over an etch depth of at least about 3500 nm, or at least about 4000 nm, or at least about 8000 nm. The features may have an ellipticity of about 1.15 or less, or about 1.05 or less. The features may be etched at a rate of at least about 125 nm/min, or at least about 175 nm/min. The features may have a Max–Bottom CD of about 70 nm or less, in some cases about 50 nm or less, or about 40 nm or less. The features may be etched with a selectivity of about 3 or greater. Any or all of these properties may be present in a particular embodiment.

Figure 4:
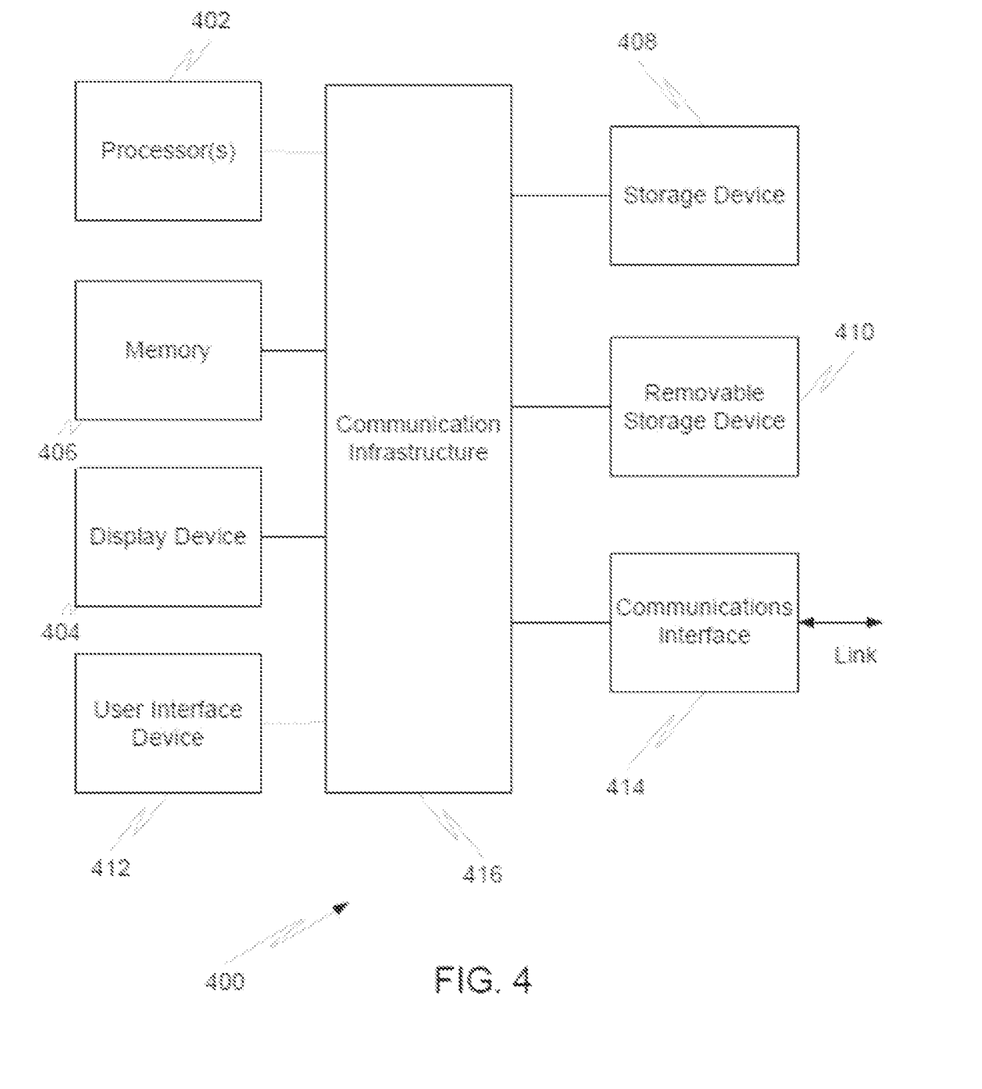
FIG. 4 is a schematic view of a computer system that may be used in practicing an embodiment.

FIG. 4 is a high level block diagram showing a computer system 400, which is suitable for implementing a controller used in various embodiments. The computer system 400 may also be used for controlling the RF plasma reactor 200 of FIGS. 2A-2C. The computer system may have many physical forms ranging from an integrated circuit, a printed circuit board, and a small handheld device, up to a huge supercomputer. The computer system 400 includes one or more processors 402, and further can include an electronic display device 404 (e.g., for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory used to store computer code or computer-executable instructions, and shall not be construed to cover transitory subject matter, such as carrier waves or signals. Examples of computer code include machine code and computer-executable instructions that may be stored on computer readable media, such as one produced by a compiler, and files containing higher level code that are executed by a computer using an interpreter. Computer readable media may also be computer code transmitted by a computer data signal embodied in a carrier wave and representing a sequence of instructions that are executable by a processor.

Computer readable media may comprise computer-executable instructions for providing the substrate on the substrate support and flowing process gas into the reaction chamber, generating plasma from the processing gas, and exposing the substrate to the plasma.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of etching recessed features on a substrate, the method comprising:
   a. providing the substrate on a substrate support in a reaction chamber, the substrate having a stack thereon, the stack comprising one or more layers of a first material comprising a silicon-containing material alternating with one or more layers of a second material, the substrate further comprising a patterned mask layer positioned over the stack;

b. flowing processing gas into the reaction chamber and generating a plasma from the processing gas, wherein the processing gas comprises:
  i. a chlorine source comprising molecules containing only carbon, hydrogen, bromine, and chlorine, or comprising molecules containing only chlorine, carbon, and nitrogen,
  ii. a carbon source,
  iii. a fluorine source, and
  iv. a hydrogen source; and c. exposing the substrate to the plasma to etch recessed features into the stack on the substrate, the recessed features being etched through one or more of the layers of the first material and through one or more of the layers of the second material, wherein the substrate support is maintained at a cryogenic temperature during etching.

2. The method of claim 1, wherein the first material comprises silicon nitride and the second material comprises silicon oxide.

3. The method of claim 2, wherein the stack further comprises one or more layers of a third material alternating with the one or more layers of the first material comprising silicon nitride and the one or more layers of the second material comprising silicon oxide.

4. The method of claim 3, wherein the third material comprises polysilicon.

5. The method of claim 1, wherein the first material comprises silicon nitride and the second material comprises polysilicon.

6. The method of claim 1, wherein the chlorine source comprises at least one species selected from the group consisting of ClCN, $CH_2BrCl$, $C_2H_2BrCl$, and $C_2H_4BrCl$.

7. The method of claim 1, wherein the substrate support is maintained at a cryogenic temperature between about −40° C. and −10° C. during etching.

8. The method of claim 1, wherein the plasma is a capacitively coupled plasma generated at an RF power between about 10-100 kW.

9. The method of claim 1, wherein the hydrogen source comprises at least one material selected from the group consisting of: $H_2$, $CH_xF_y$ (where $1 \leq x \leq 4$, and x+y=4), $C_xH_yF_z$ (where z>0), and combinations thereof.

10. The method of claim 1, wherein the hydrogen source comprises $H_2$.

11. The method of claim 1, wherein the fluorine source comprises at least one material selected from the group consisting of: $NF_3$, $CH_xF_y$ (where $0 \leq x \leq 3$, and x+y=4), $C_xF_y$ (where y>x), $C_xH_yF_z$ (where z>0), and combinations thereof.

12. The method of claim 1, wherein the carbon source comprises at least one material selected from the group consisting of: $CH_xF_y$ (where $0 \leq x \leq 4$, and x+y=4), $C_xF_y$ (where y>x), $C_xH_yF_z$ (where z>0), and combinations thereof.

13. The method of claim 1, wherein the processing gas comprises $Cl_2$, $H_2$, $NF_3$, $CH_2F_2$, $CF_4$, and at least one of HBr and $CF_3I$.

14. The method of claim 1, wherein the recessed features that are formed have a 3σ twist of about 10 nm or less.

15. The method of claim 1, wherein the recessed features that are formed have a depth of at least about 4000 nm.

16. The method of claim 1, wherein the recessed features that are formed have an ellipticity of about 1.15 or less.

17. The method of claim 1, wherein the recessed features that are formed have a maximum critical dimension of about 115 nm or less, and/or a Max–Bottom CD of about 40 nm or less.

* * * * *